(12) United States Patent
Shim

(10) Patent No.: US 7,548,101 B2
(45) Date of Patent: Jun. 16, 2009

(54) DELAY LOCKED LOOP CIRCUIT FOR SEMICONDUCTOR MEMORY APPARATUS

(75) Inventor: Seok-Bo Shim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 115 days.

(21) Appl. No.: 11/826,916

(22) Filed: Jul. 19, 2007

(65) Prior Publication Data
US 2008/0143404 A1  Jun. 19, 2008

(30) Foreign Application Priority Data
Dec. 18, 2006  (KR) .................. 10-2006-0129582

(51) Int. Cl.
H03K 3/017  (2006.01)
(52) U.S. Cl. .................. 327/175; 327/156; 327/293
(58) Field of Classification Search .................. 327/147, 327/149, 150, 156, 158, 159, 175, 291, 292, 327/293, 295, 296, 297
See application file for complete search history.

(56) References Cited

U.S. PATENT DOCUMENTS 5,133,064 A * 7/1992 Hotta et al. .................. 713/375
6,798,248 B2 * 9/2004 Hazucha et al. ............... 326/93
6,813,197 B2 11/2004 Park
6,989,700 B2 1/2006 Kim
7,103,133 B2 9/2006 Jung
7,154,311 B2 12/2006 Lim
7,170,313 B2 1/2007 Shin
2006/0267649 A1 11/2006 Park et al.

FOREIGN PATENT DOCUMENTS

JP          2005251370       9/2005
KR       1020040091975       11/2004
KR       1020040095965       11/2004

* cited by examiner

Primary Examiner—Jeffrey S Zweizig
(74) Attorney, Agent, or Firm—Venable LLP; Jeffri A. Kaminski

(57) ABSTRACT

A delay locked loop circuit for a semiconductor memory apparatus includes a duty cycle correcting part that corrects and outputs duty cycles of internal clocks. A clock pulse width detecting part detects a pulse width of an external clock and outputs a pulse width detecting signal. A driving part divides a phase of the output of the duty cycle correcting part, adjusts a pulse width of at least one of two signals, which are obtained by dividing the phase, in accordance with the pulse width detecting signal, and outputs the two signals as delay locked loop clocks.

20 Claims, 9 Drawing Sheets

[FIG. 1]
PRIOR ART
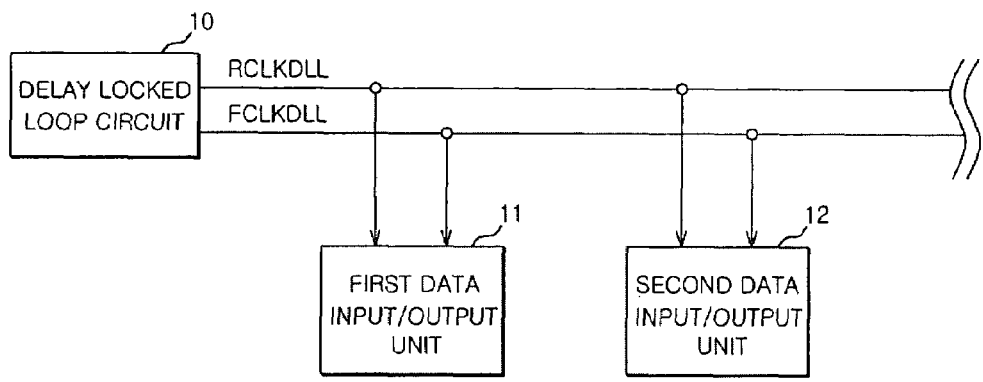
[FIG. 2]
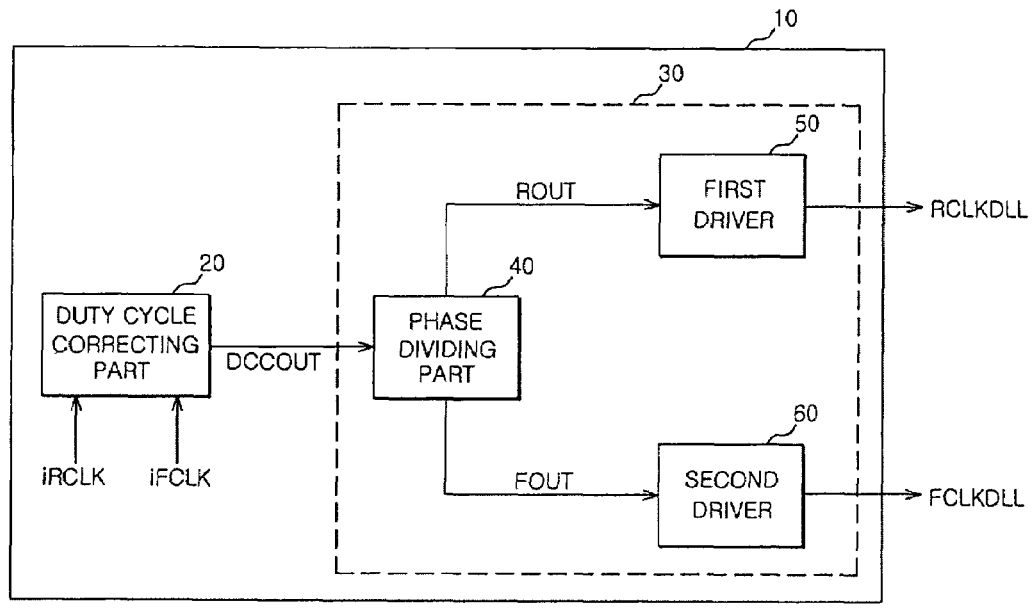
PRIOR ART

[FIG. 3]
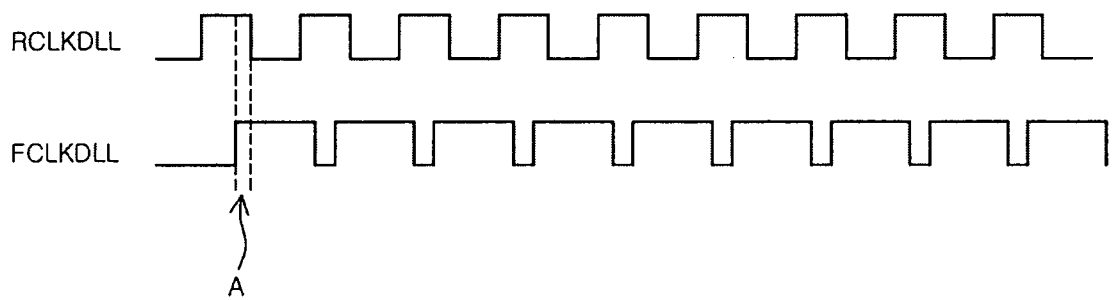
PRIOR ART

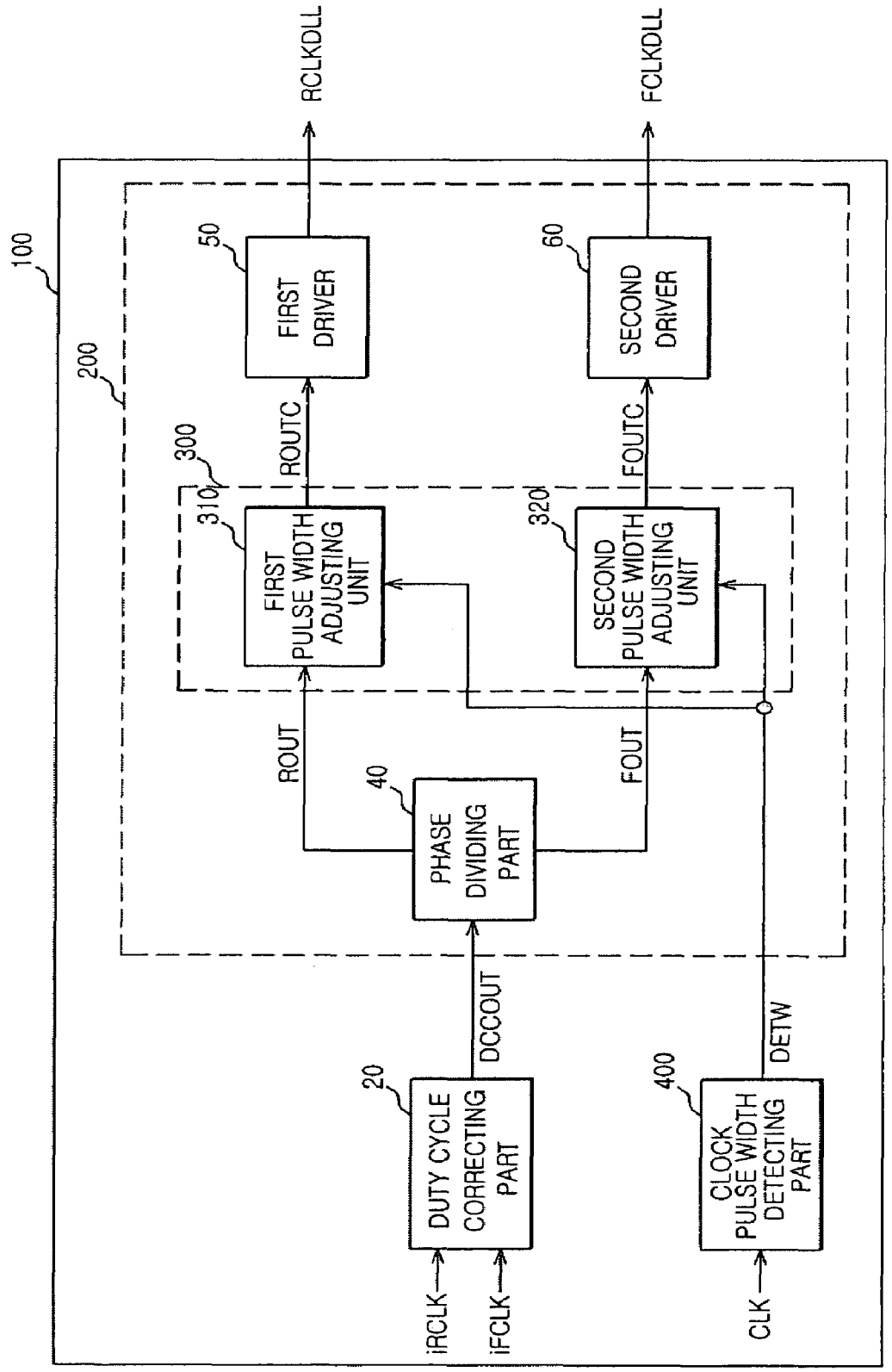
[FIG. 4]

[FIG. 5]
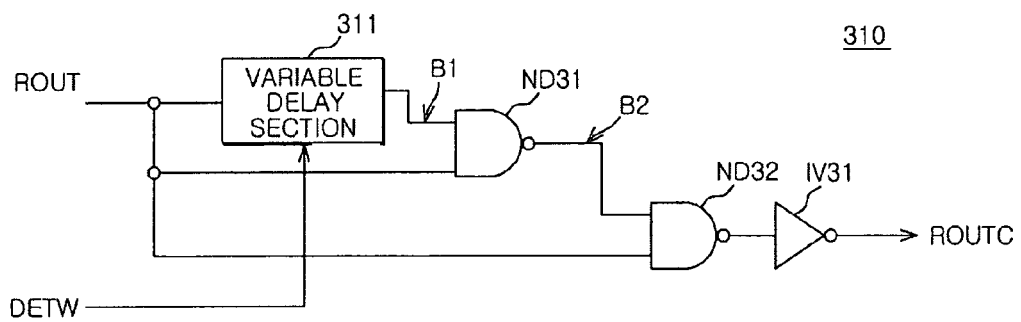
[FIG. 6]
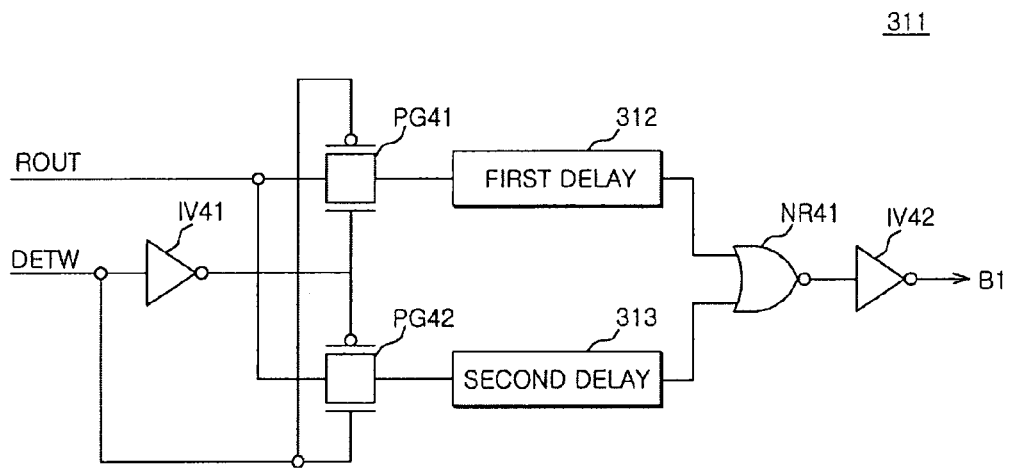

[FIG. 7]
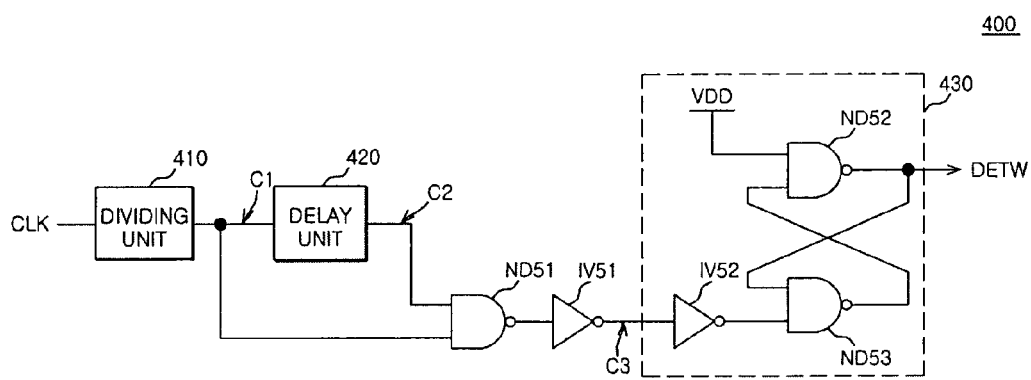
[FIG. 8A]
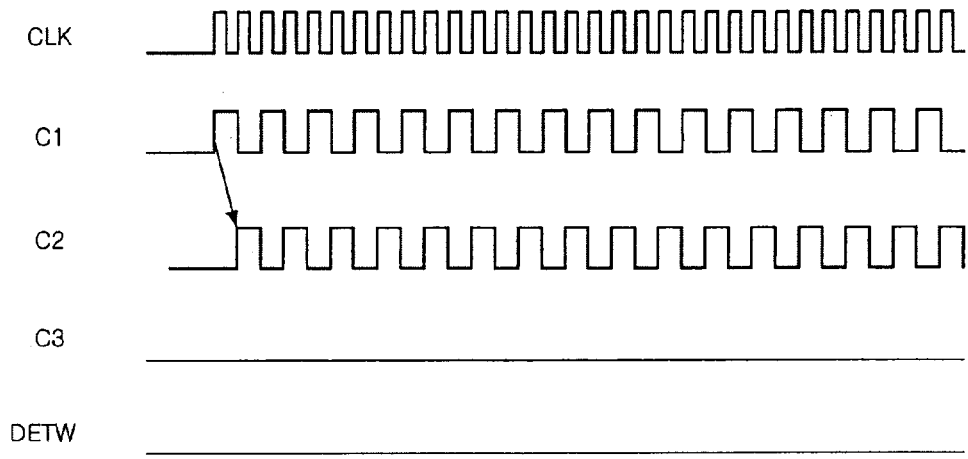

[FIG. 8B]
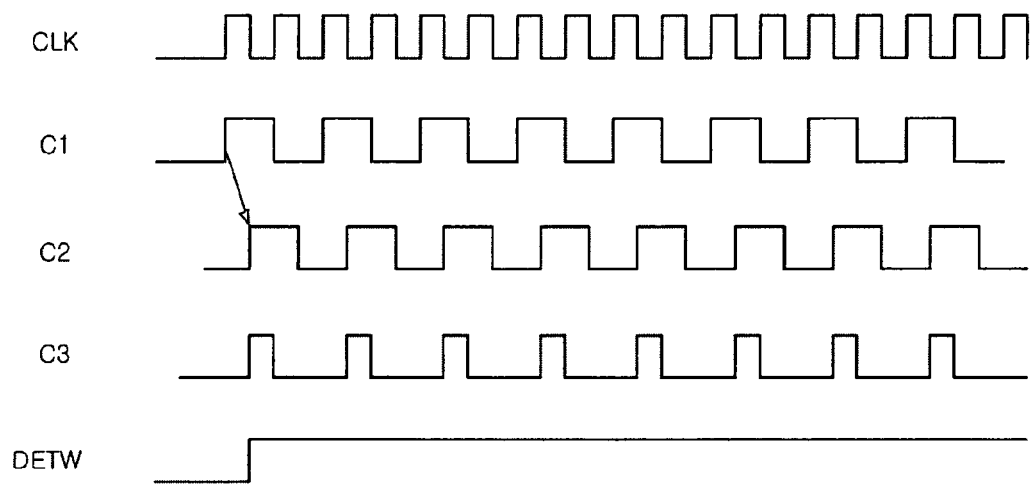
[FIG. 9A]
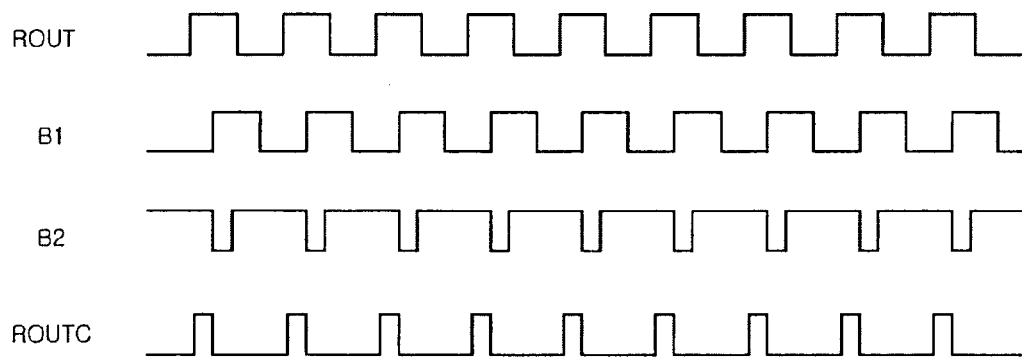

[FIG. 9B]
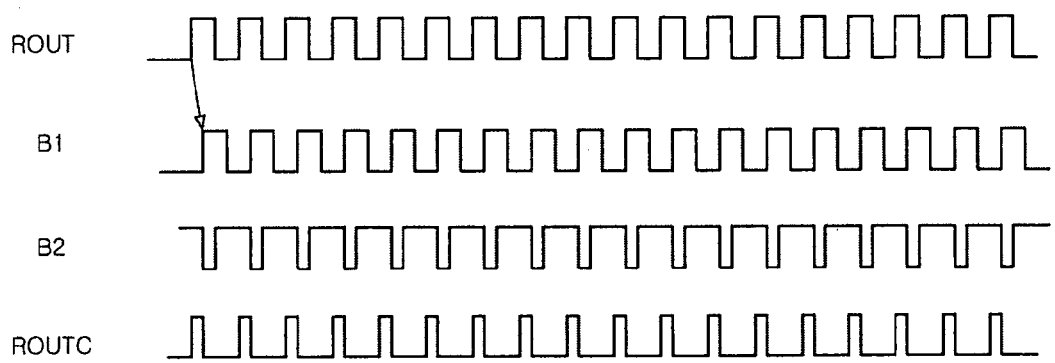

[FIG. 10]
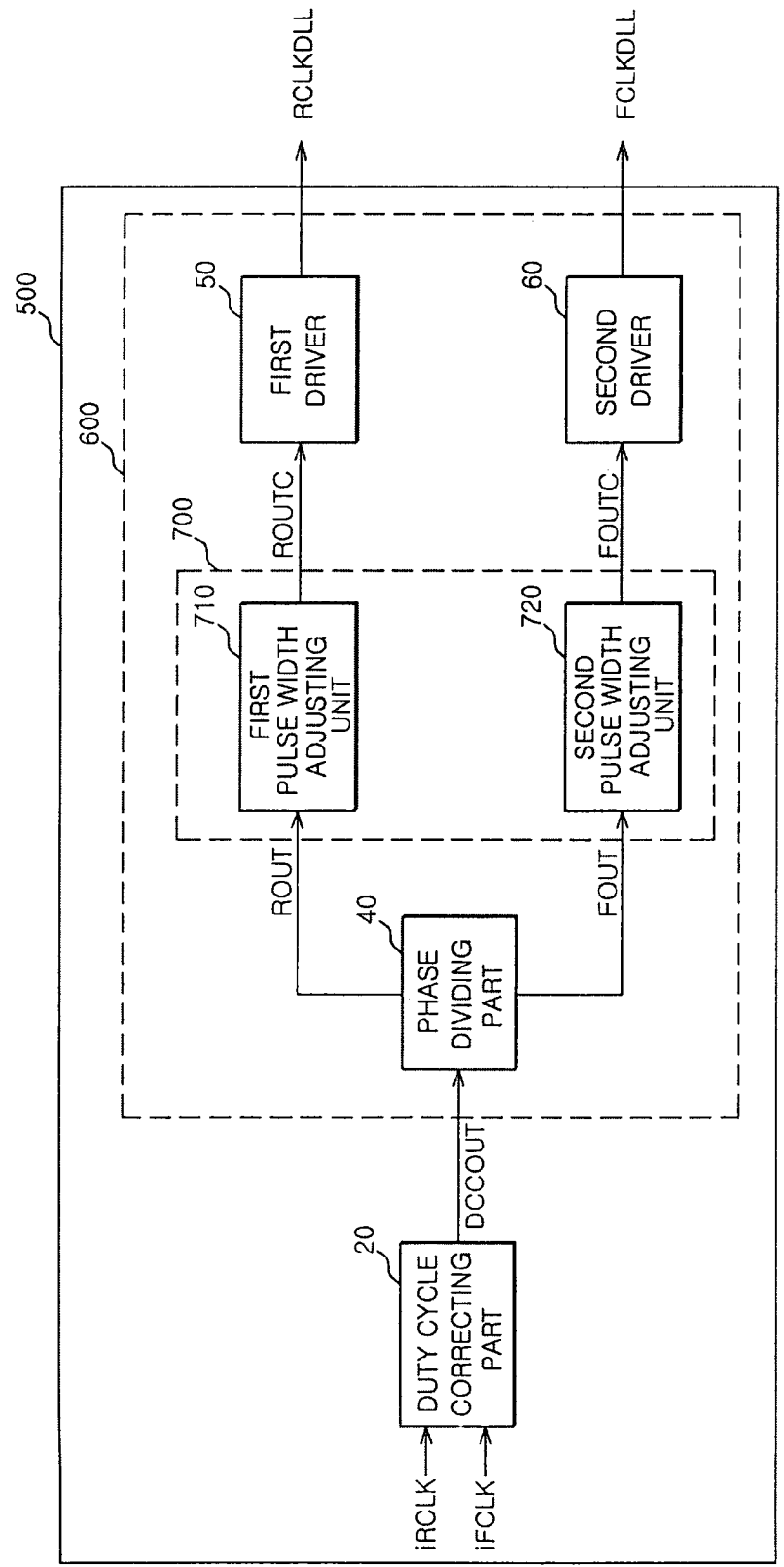

[FIG. 11]
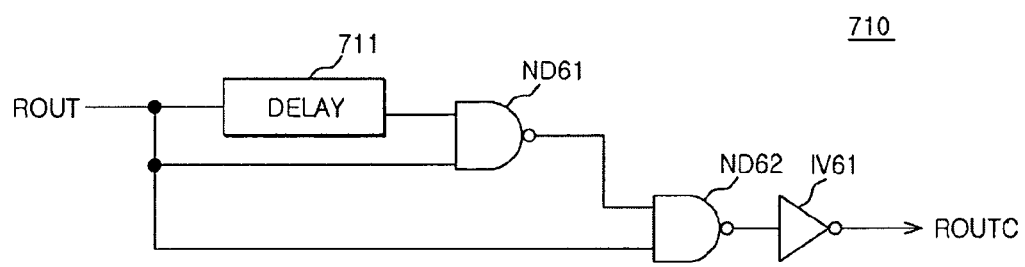

DELAY LOCKED LOOP CIRCUIT FOR SEMICONDUCTOR MEMORY APPARATUS

CROSS-REFERENCE TO RELATED PATENT APPLICATION

This application claims the benefit of Korean Patent Application No. 10-2006-0129582, filed on Dec. 18, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and more particularly, to a delay locked loop circuit for a semiconductor memory apparatus that is capable of preventing errors due to a transmission path of a delay locked loop clock from occurring.

2. Related Art

A delay locked loop (DLL) circuit generates delay locked loop clocks RCLKDLL and FCLKDLL to synchronize a phase of an external clock CLK supplied from the outside of a semiconductor memory apparatus and a phase of an internal clock iclk used inside the semiconductor memory apparatus.

The delay locked loop clock RCLKDLL is synchronized with a rising edge of the external clock CLK, and the delay locked loop clock FCLKDLL is synchronized with a falling edge of the external clock CLK.

As shown in FIG. 1, the delay locked loop clocks RCLKDLL and FCLKDLL, which are output by a delay locked loop circuit 10 for a semiconductor memory apparatus, pass through signal lines and are supplied to a first data input/output unit 11 and a second data input/output unit 12, respectively.

The first and second data input/output units 11 and 12 are constructed to process half of the input/output data by using the delay locked loop clocks RCLKDLL and FCLKDLL. For example, if the number of bits of all of the data that is output according to an input command or an output command is 16 bits, the first data input/output unit 11 processes 8 data bits that correspond to bit numbers 0 to 7 and the second data input/output unit 12 processes the remaining data.

As the semiconductor memory apparatus operates at a high speed and processes an increasing data load, the semiconductor memory apparatus generally uses a plurality of data input/output units so as to smoothly perform a data input/output operation.

The first and second data input/output units 11 and 12 perform delay and timing adjustment on the delay locked loop clocks RCLKDLL and FCLKDLL in accordance with time tAC required to access data from a point of time when a clock CLK is generated and column access strobe latency, in consideration of skews of the delay locked loop clocks RCLKDLL and FCLKDLL.

As shown in FIG. 2, the delay locked loop circuit 10 according to the related art includes a duty cycle correcting part 20 and a delay locked loop clock driving part 30.

The delay locked loop clock driving part 30 includes a phase dividing part 40, a first driver 50, and a second driver 60.

The operation of the delay locked loop circuit according to the related art that has the above-described structure will now be described.

The duty cycle correcting part 20 corrects and outputs duty cycles of internal clocks iRCLK and iFCLK that are delayed and locked by a delay loop (not shown) in the delay locked loop circuit 10.

The phase dividing part 40 of the delay locked loop clock driving part 30 divides a phase of the output DCCOUT of the duty cycle correcting part 20 and outputs phase dividing signals ROUT and FOUT.

The first driver 50 of the delay locked loop clock driving part 30 drives the phase dividing signal ROUT as the delay locked loop clock RCLKDLL and outputs it to a signal line outside the delay locked loop circuit 10.

The second driver 60 drives the phase dividing signal FOUT as the delay locked loop clock FCLKDLL and outputs it to a signal line outside the delay locked loop circuit 10.

In the semiconductor memory apparatus according to the related art, the delay locked loop clocks RCLKDLL and FCLKDLL have the above-described skews while being transmitted through the signal lines, as shown in FIG. 1.

The first and second data input/output units 11 and 12 shown in FIG. 1 correct the skews of the delay locked loop clocks RCLKDLL and FCLKDLL.

As shown in FIG. 1, in the semiconductor memory apparatus according to the related art, the signal lines that are connected to the first and second data input/output units 11 and 12 are asymmetrical. For this reason, it is not possible to correct the skews of the delay locked loop clocks RCLKDLL and FCLKDLL. As a result, the skews of the delay locked loop clocks RCLKDLL and FCLKDLL become worse.

The semiconductor memory apparatus causes a timing error because of the skews of the delay locked loop clocks RCLKDLL and FCLKDLL. In a normal case, the two delay locked loop clocks RCLKDLL and FCLKDLL do not overlap each other. However, as shown in FIG. 3, since the two delay locked loop clocks RCLKDLL and FCLKDLL overlap each other during an interval of "A", the semiconductor memory apparatus causes a timing error.

In the case of a double data rate dynamic RAM (DDR RAM), the DDR RAM receives or outputs data at timings that are synchronized with rising and falling edges of the clocks. Accordingly, when the overlapping clock interval exists, such as during the interval "A" shown in FIG. 3, an excessive data input/output error may occur due to an erroneous operation performed by a data input/output structure.

The above-described problems in the related art occur due to the difference in a width of a high-level interval between the delay locked loop clocks RCLKDLL and FCLKDLL, as shown in FIG. 3. Therefore, it is not possible to resolve the problems in the related art by delaying either the delay locked loop clock RCLKDLL or the delay locked loop clock FCLKDLL. Further, to delay the delay locked loop clocks RCLKDLL and FCLKDLL causes another problem in that it is difficult for the first and second data input/output units to adjust the data access time tAC.

SUMMARY OF THE INVENTION

Embodiments of the present invention may provide a delay locked loop circuit for a semiconductor memory apparatus that may be capable of preventing a timing error from occurring while delay locked loop clocks are transmitted.

An embodiment of the present invention may provide a delay locked loop circuit for a semiconductor memory apparatus. The delay locked loop circuit may include a duty cycle correcting part that may correct and output duty cycles of internal clocks, a clock pulse width detecting part that may detect a pulse width of an external clock and output a pulse width detecting signal, and a driving part that may divide a phase of the output of the duty cycle correcting part, adjust a pulse width of at least one of two signals, which are obtained by dividing the phase, in accordance with the pulse width detecting signal, and output the two signals as delay locked loop clocks.

Another embodiment of the present invention may provide a delay locked loop circuit for a semiconductor memory apparatus. The delay locked loop circuit may include a duty cycle correcting part that may correct and output duty cycles of internal clocks, and a driving part that may divide a phase of the output of the duty cycle correcting part, adjust a pulse width of at least one of two signals obtained by dividing the phase, and output the two signals as delay locked loop clocks.

BRIEF DESCRIPTION OF THE DRAWINGS

FIG. 1 is a block diagram illustrating a transmission path of a delay locked loop clock in a semiconductor memory apparatus according to the related art;

FIG. 2 is a block diagram illustrating a delay locked loop circuit in a semiconductor memory apparatus according to the related art;

FIG. 3 is a timing diagram illustrating an occurrence of an error in a delay locked loop clock of a semiconductor memory apparatus according to the related art;

FIG. 4 is a block diagram illustrating an exemplary delay locked loop circuit for a semiconductor memory apparatus according to an embodiment of the present invention;

FIG. 5 is a circuit diagram illustrating an exemplary first pulse width adjusting unit shown in FIG. 4;

FIG. 6 is a circuit diagram illustrating an exemplary variable delay section shown in FIG. 5;

FIG. 7 is a circuit diagram illustrating an exemplary clock pulse width detecting unit shown in FIG. 4;

FIGS. 8A and 8B are timing diagrams illustrating an example of the operation of a clock pulse width detecting part shown in FIG. 7;

FIGS. 9A and 9B are timing diagrams illustrating an example of the operation of a first pulse width adjusting unit shown in FIG. 5;

FIG. 10 is a block diagram illustrating an exemplary delay locked loop circuit for a semiconductor memory apparatus according to another embodiment of the present invention; and FIG. 11 is a circuit diagram illustrating an exemplary first pulse width adjusting unit shown in FIG. 10.

DESCRIPTION OF EXEMPLARY EMBODIMENTS

Embodiments will now be described in detail with reference to the accompanying drawings.

As shown in FIG. 4, a delay locked loop circuit 100 for a semiconductor memory apparatus according to an embodiment of the present invention may include a duty cycle correcting part 20 that may correct and output duty cycles of internal clocks iRCLK and iFCLK, a clock pulse width detecting part 400 that may detect a clock pulse width of an external clock CLK and output a pulse width detecting signal DETW, and a delay locked loop clock driving part 200 that may divide a phase of the output of the duty cycle correcting part 20, adjust a pulse width of at least one of two signals ROUT and FOUT whose phase has been divided in response to the pulse width detecting signal DETW, and output them as the delay locked loop clocks RCLKDLL and FCLKDLL.

The delay locked loop clock driving part 200 may include a phase dividing part 40 that may divide and output the output of the duty cycle correcting part 20 into the first and second phase signals ROUT and FOUT, a pulse width adjusting part 300 that may adjust and output a pulse width of at least one of the first and second phase signals ROUT and FOUT in accordance with the pulse width detecting signal DETW, and first and second drivers 50 and 60 that may drive the output of the pulse width adjusting part 300.

However, the present invention is not limited thereto, and the pulse width adjusting part 300 may be constructed such that the pulse width adjusting part 300 adjusts a pulse width of either the first phase signal ROUT or the second phase signal FOUT, or adjusts pulse widths of both of the first phase signal ROUT and the second phase signal FOUT.

As an example, a description of the pulse width adjusting part 300 that adjusts pulse widths of both of the first phase signal ROUT and the second phase signal FOUT is provided. As shown in FIG. 4, the exemplary pulse width adjusting part 300 may include a first pulse width adjusting unit 310 that decreases and outputs a pulse width of the first phase signal ROUT by a width corresponding to the pulse width detecting signal DETW, and a second pulse width adjusting unit 320 that decreases and outputs a pulse width of the second phase signal FOUT by the width corresponding to the pulse width detecting signal DETW.

As shown in FIG. 5, the exemplary first pulse width adjusting unit 310 may include a variable delay section 311 that delays and outputs the first phase signal ROUT by a delay time corresponding to the pulse width detecting signal DETW, a first NAND gate ND31 that performs a NAND operation on the first phase signal ROUT and the output of the variable delay section 311, and a second NAND gate ND32 and an inverter IV31 that perform a logical product operation on the outputs of the first NAND gate ND31 and the first phase signal ROUT.

As shown in FIG. 6, the exemplary variable delay section 311 may include a first inverter IV41 that receives the pulse width detecting signal DETW, a first pass gate PG41 that passes the first phase signal ROUT according to the pulse width detecting signal DETW and the output of the first inverter IV41, a second pass gate PG42 that passes the first phase signal ROUT according to the output of the first inverter IV41 and the pulse width detecting signal DETW, a first delay 312 that delays and outputs the output of the first pass gate PG41 by a first delay time, a second delay 313 that delays and outputs the output of the second pass gate PG42 by a second delay time, and a NOR gate NR41 and a second inverter IV42 that perform a logical sum operation on the output of the first and second pass gates PG41 and PG42. The delay time of the second delay 313 may be, for example, set to be longer than the delay time of the first delay 312.

The second pulse width adjusting unit 320 shown in FIG. 4 may have the same structure as the first pulse width adjusting unit 310.

Meanwhile, when the pulse width adjusting part 300 may adjust only the pulse width of the first phase signal ROUT, the second pulse width adjusting unit 320 may be removed, and the second phase signal FOUT may be directly applied to the second driver 60, in the structure shown in FIG. 4.

When the pulse width adjusting part 300 adjusts only the pulse width of the second phase signal FOUT, the first pulse width adjusting unit 310 may be removed, and the first phase signal ROUT may be directly applied to the first driver 50, in the structure shown in FIG. 4.

As shown in FIG. 7, the exemplary clock pulse width detecting part 400 may include a dividing unit 410 that divides a frequency of the external clock CLK, a delay unit 420 that delays the output of the dividing unit 410, a first NAND gate ND51 that receives the output of the dividing unit 410 and the output of the delay unit 420, a first inverter IV51 that receives the output of the first NAND gate ND51, and a latch 430 that receives the output of the first inverter IV51. In the exemplary clock pulse width detecting part 400, the dividing unit 410 may divide and output the frequency of the external clock CLK with a predetermined magnitude (for example, ½). The delay unit 420 delays and outputs the output of the dividing unit 410 by a predetermined delay time. The first NAND gate ND51 and the first inverter IV51 perform a logical product operation on the output of the dividing unit 410 and the output of the delay unit 420 and output the operation result.

The latch 430 may include a second NAND gate ND52 that has a first input terminal supplied with a power supply voltage VDD and an output terminal outputting the pulse width detecting signal DETW, a second inverter IV52 that receives the output of the first inverter IV51, and a third NAND gate ND53 that has a first input terminal receiving the output of the second NAND gate ND52, a second input terminal receiving the output of the second inverter IV52, and an output terminal connected to a second input terminal of the second NAND gate ND52.

The exemplary latch 430 outputs the pulse width detecting signal DETW at a low level when an output level of the first inverter IV51 is at a low level from the start of an initial operation, and outputs the pulse width detecting signal DETW at a high level when the output level of the first inverter IV51 is shifted to a high level. For example, when the frequency of the external clock CLK is high and a pulse width of the external clock CLK is small, as shown in FIG. 8A, if a logical product operation is performed on the output C1 of the dividing unit 410 and the output C2 of the delay unit 420, the output C3 of the first inverter IV51 is maintained at a low level. Thus, the pulse width detecting signal DETW is output at a low level by the latch 430. Accordingly, when the pulse width detecting signal DETW is at a low level, the clock pulse width is small. Meanwhile, when the frequency of the external clock CLK is low and a pulse width of the external clock CLK is large, as shown in FIG. 8B, if a logical product operation is performed on the output C1 of the dividing unit 410 and the output C2 of the delay unit 420, the output C3 of the first inverter IV51 may be a pulse in which a high-level interval is repeated. Thus, the pulse width detecting signal DETW may be output at a high level by the latch 430. Accordingly, when the pulse width detecting signal DETW is at a high level, the clock pulse width is large.

An example of the operation of the exemplary delay locked loop circuit for a semiconductor memory apparatus according to an embodiment of the present invention that has the above-described structure will now be described.

The duty cycle correcting part 20 corrects the duty cycles of the internal clocks iRCLK and iFCLK and outputs the signal DCCOUT.

As shown in FIGS. 8A and 8B, the clock pulse width detecting part 400 outputs the pulse width detecting signal DETW according to the pulse width of the external clock CLK.

The phase dividing part 40 divides the phase of the signal DCCOUT and outputs the first and second phase signals ROUT and FOUT.

The pulse width adjusting part 300 adjusts the pulse widths of the first and second phase signals ROUT and FOUT in accordance with the pulse width detecting signal DETW, and outputs the first and second phase signals ROUT and FOUT.

The first pulse width adjusting unit 310 may perform the same pulse width adjusting operation as the second pulse width adjusting unit 320. Therefore, only the operation of the first pulse width adjusting unit 310 is described.

An exemplary description of the case when the pulse width detecting signal DETW is at a high level, that is, the frequency of the external clock CLK is low and the pulse width of the external clock CLK is large, is provided.

The exemplary variable delay section 311 shown in FIG. 6 may delay and output the first phase signal ROUT by the delay time of the second delay 313 that may be, for example, longer than the delay time of the first delay 312, as shown in FIG. 9A. The first NAND gate ND31 shown in FIG. 5 outputs a signal B2 that is obtained by performing a NAND operation on the output B1 of the variable delay section 311 and the first phase signal ROUT. The second NAND gate ND32 and the inverter IV31 perform a logical product operation on the signal B2 and the first phase signal ROUT and outputs the signal ROUTC in which the pulse width of the first phase signal ROUT is decreased by a width corresponding to a delay time by the second delay 313.

An exemplary description of the case when the pulse width detecting signal DETW is at a low level, that is, the frequency of the external clock CLK is high and the pulse width of the external clock CLK is small is now provided.

The exemplary variable delay section 311 shown in FIG. 6 may delay and output the first phase signal ROUT by the delay time by the first delay 312, as shown in FIG. 9B. The first NAND gate ND31 shown in FIG. 5 outputs the signal B2 that is obtained by performing a NAND operation on the output B1 of the variable delay section 311 and the first phase signal ROUT. The second NAND gate ND32 and the inverter IV31 perform a logical product operation on the signal B2 and the first phase signal ROUT and output the signal ROUTC in which the pulse width of the first phase signal ROUT is decreased by a width corresponding to the delay time by the first delay 312.

Each of the first pulse width adjusting unit 310 and the second pulse width adjusting unit 320 may detect a pulse width of the external clock CLK and adjust the pulse width by a different width. The first pulse width adjusting unit 310 and the second pulse width adjusting unit 320 may allow the pulse widths of the signals ROUTC and FOUTC to be constant, even when the pulse width of the external clock CLK is changed.

The first and second drivers 50 and 60 drive the signals ROUTC and FOUTC and output them as the delay locked loop clocks RCLKDLL and FCLKDLL.

The width of a high-level interval may be decreased in the delay locked loop clocks RCLKDLL and FCLKDLL, as compared with the case where the delay locked loop clocks RCLKDLL and FCLKDLL are generated without passing through the pulse width adjusting part 300. Even if the pulse width of the external clock CLK changes as the frequency changes, the widths of the high-level intervals of the delay locked loop clocks RCLKDLL and FCLKDLL may be maintained at predetermined widths. That is, even though the delay locked loop clocks RCLKDLL and FCLKDLL are output to the outside of the delay locked loop circuit and skews are generated through the asymmetrical signal lines, an overlapping interval may not occur.

As shown in FIG. 10, an exemplary delay locked loop circuit 500 for a semiconductor memory apparatus according to another embodiment of the present invention may include a duty cycle correcting part 20 that may correct and output duty cycles of internal clocks iRCLK and iFCLK, and a delay locked loop clock driving part 600 that may divide a phase of the output of the duty cycle correcting part 20, adjust a pulse width of at least one of two signals ROUT and FOUT whose phase is divided, and output them as delay locked loop clocks RCLKDLL and FCLKDLL.

The exemplary delay locked loop clock driving part 600 may include a phase dividing part 40 that may divide and output the output DCCOUT of the duty cycle correcting part 20 into the first and second phase signals ROUT and FOUT, a pulse width adjusting part 700 that may adjust and output a pulse width of at least one of the first and second phase signals ROUT and FOUT, and first and second drivers 50 and 60 that may drive the output of the pulse width adjusting part 700. When the pulse width adjusting part 700 adjusts only the pulse width of the first phase signal ROUT, the second pulse width adjusting unit 720 shown in FIG. 10 may be removed, and the second phase signal FOUT may be directly applied to the second driver 60. Meanwhile, when the pulse width adjusting part 700 adjusts the pulse width of the second phase signal FOUT, the first pulse width adjusting unit 710 shown in FIG. 10 may be removed, and the first phase signal ROUT may be directly applied to the first driver 50.

However, the present invention is not limited thereto, and the pulse width adjusting part 700 may be constructed to adjust a pulse width of either the first phase signal ROUT or the second phase signal FOUT, or pulse widths of both of the first phase signal ROUT and the second phase signal FOUT.

An example of the pulse width adjusting part 700 that adjusts the pulse widths of the first and second phase signals ROUT and FOUT, is shown in FIG. 10. The pulse width adjusting part 700 may include the first pulse width adjusting unit 710 that decreases and outputs the pulse width of the first phase signal ROUT by a predetermined width, and the second pulse width adjusting unit 720 that decreases and outputs the pulse width of the second phase signal FOUT by a predetermined width.

As shown in FIG. 11, the first pulse width adjusting unit 710 may include a delay 711 that delays and outputs the first phase signal ROUT by a predetermined delay time, a first NAND gate ND61 that performs a NAND operation on the first phase signal ROUT and the output of the delay 711, and a second NAND gate ND62 and an inverter IV61 that perform a logical product operation on the output of the first NAND gate ND61 and the first phase signal ROUT.

The second pulse width adjusting unit 720 shown in FIG. 10 may have the same structure as the first pulse width adjusting unit 710. However, the delay time of the delay 711 of the first pulse width adjusting unit 710 may be equal to or different from the delay time of the delay of the second pulse width adjusting unit 720, based on a particular circuit design.

Meanwhile, when the pulse width adjusting part 700 adjusts only the pulse width of the first phase signal ROUT, the second pulse width adjusting unit 720 may be removed, and the second phase signal FOUT may be directly applied to the second driver 60, in the structure shown in FIG. 10.

When the pulse width adjusting part 700 adjusts only the pulse width of the second phase signal FOUT, the first pulse width adjusting unit 710 may be removed, and the first phase signal ROUT may be directly applied to the first driver 50, in the structure shown in FIG. 10.

An example of the operation of the exemplary delay locked loop circuit for a semiconductor memory apparatus according to another embodiment of the present invention that has the above-described structure will now be described.

The duty cycle correcting part 20 corrects the duty cycles of the internal clocks iRCLK and iFCLK and outputs a signal DCCOUT.

The phase dividing part 40 divides a phase of the signal DCCOUT and outputs the first and second phase signals ROUT and FOUT.

The pulse width adjusting part 700 adjusts and outputs the pulse widths of the first and second phase signals ROUT and FOUT.

The first pulse width adjusting unit 710 may perform the same pulse width adjusting operation as the second pulse width adjusting unit 720. Therefore, only an example of the operation of the first pulse width adjusting unit 710 is described. As shown in FIG. 11, the delay 711 delays and outputs the first phase signal ROUT by a predetermined delay time. The first NAND gate ND61 performs a NAND operation on the output of the delay 711 and the first phase signal ROUT and outputs the operation result. The second NAND gate ND62 and the inverter IV61 perform a logical product operation on the output of the first NAND gate ND61 and the first phase signal ROUT and outputs a signal ROUTC in which the pulse width of the first phase signal ROUT may be decreased by a width corresponding to a delay time by the delay 711.

The first pulse width adjusting unit 710 and the second pulse width adjusting unit 720 output the signals ROUTC and FOUTC that are obtained by decreasing the pulse widths of the first and second phase signals ROUT and FOUT by the predetermined widths, respectively.

The first and second drivers 50 and 60 drive the signals ROUTC and FOUTC and output them as the delay locked loop clocks RCLKDLL and FCLKDLL.

The widths of high-level intervals may be decreased in the delay locked loop clocks RCLKDLL and FCLKDLL, as compared with the case where the delay locked loop clocks RCLKDLL and FCLKDLL are generated without passing through the pulse width adjusting unit 700. Accordingly, even if the delay locked loop clocks RCLKDLL and FCLKDLL are output to the outside of the delay locked loop circuit and skews are generated through the asymmetrical signal lines, an overlapping interval may not occur.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

The delay locked loop circuit for the semiconductor memory apparatus according to embodiments of the present invention may adjust and output the pulse width of the delay locked loop clock when the delay locked loop clock is output to the outside of the delay locked loop circuit and passes through the asymmetrical signal lines. Therefore, it may be possible to prevent a timing error of the delay locked loop clock from occurring on a transmission path, which improves a function of the semiconductor memory apparatus.

The delay locked loop circuit for the semiconductor memory apparatus according to the embodiments of the present invention may adjust the pulse width of the delay locked loop clock in response to the change in the pulse width of the external clock. Therefore, it may be possible to adjust to the changes in the operational frequency in the semiconductor memory apparatus.

What is claimed is:

1. A delay locked loop circuit for a semiconductor memory apparatus, the delay locked loop circuit comprising:
   a duty cycle correcting part configured to correct and output duty cycles of internal clocks;
   a clock pulse width detecting part configured to detect a pulse width of an external clock and output a pulse width detecting signal based thereon; and
   a driving part configured to divide a phase of the duty cycles output of the duty cycle correcting part, adjust a pulse width of at least one of two signals, which are obtained by dividing the phase, in accordance with the pulse width detecting signal, and output the two signals as delay locked loop clocks.

2. The delay locked loop circuit of claim 1,
   wherein the clock pulse width detecting part includes:
   a dividing unit configured to divide a frequency of the external clock to provide an output;
   a delay unit configured to delay the output of the dividing unit to provide an output;
   a first logic circuit configured to receive the output of the dividing unit and the output of the delay unit to provide an output; and
   a latch configured to receive the output of the first logic circuit and output the pulse width detecting signal.

3. The delay locked loop circuit of claim 2,
   wherein the first logic circuit is configured to perform a logical product operation.

4. The delay locked loop circuit of claim 2,
   wherein the latch includes:
   a first logic element having a first input terminal configured to receive a power supply voltage, a second input terminal, and an output terminal configured to output the pulse width detecting signal;
   an inverting element configured to receive the output of the first logic circuit to provide an output; and
   a second logic element having a first input terminal configured to receive the pulse width detecting signal output of the first logic element, a second input terminal configured to receive the output of the inverting element, and an output terminal connected to the second input terminal of the first logic element.

5. The delay locked loop circuit of claim 1,
   wherein the driving part includes:
   a phase dividing part configured to divide and output the duty cycles output of the duty cycle correcting part into first and second phase signals; and
   a pulse width adjusting part configured to adjust and output a pulse width of at least one of the first and second phase signals in accordance with the pulse width detecting signal.

6. The delay locked loop circuit of claim 5,
   wherein the pulse width adjusting part includes:
   a first pulse width adjusting unit configured to decrease and output the pulse width of the first phase signal by a width corresponding to the pulse width detecting signal; and
   a second pulse width adjusting unit configured to decrease and output the pulse width of the second phase signal by a width corresponding to the pulse width detecting signal.

7. The delay locked loop circuit of claim 6,
   wherein the first pulse width adjusting unit includes:
   a variable delay section configured to delay and output the first phase signal by a delay time corresponding to the pulse width detecting signal;
   a logic element configured to perform a logical operation on the first phase signal and the output of the variable delay section to provide an output; and
   a second logic circuit configured to perform a logical operation on the output of the logic element and the first phase signal.

8. The delay locked loop circuit of claim 7,
   wherein the variable delay section includes:
   a plurality of switching elements configured to pass as outputs the first phase signal in accordance with the pulse width detecting signal;
   a plurality of delay elements configured to delay respective outputs of the plurality of switching elements by different delay times to provide outputs; and
   a third logic circuit configured to perform a logical operation on the outputs of the plurality of delay elements.

9. The delay locked loop circuit of claim 8,
   wherein the plurality of switching elements comprise pass gates.

10. The delay locked loop circuit of claim 8,
    wherein the third logic circuit is configured to perform a logic sum operation on the outputs of the plurality of delay elements.

11. The delay locked loop circuit of claim 7,
    wherein the second logic circuit is configured to perform a logical product operation on the output of the logic element and the first phase signal.

12. The delay locked loop circuit of claim 6,
    wherein the second pulse width adjusting unit comprises a same structure as the first pulse width adjusting unit.

13. The delay locked loop circuit of claim 5,
    wherein the driving part further includes first and second drivers configured to drive the pulse width output of the pulse width adjusting part and the first and second phase signals output of the phase dividing part.

14. A delay locked loop circuit for a semiconductor memory apparatus, the delay locked loop circuit comprising:
    a duty cycle correcting part configured to correct and output duty cycles of internal clocks; and
    a driving part configured to divide a phase of the duty cycles output of the duty cycle correcting part, adjust a pulse width of at least one of two signals obtained by dividing the phase, and output the two signals as delay locked loop clocks.

15. The delay locked loop circuit of claim 14,
    wherein the driving part includes:
    a phase dividing part configured divide and output the duty cycle output of the duty cycle correcting part into first and second phase signals; and
    a pulse width adjusting part configured to adjust and output a pulse width of at least one of the first and second phase signals.

16. The delay locked loop circuit of claim 15,
    wherein the pulse width adjusting part includes:
    a first pulse width adjusting unit configured to decrease and output a pulse width of the first phase signal; and
    a second pulse width adjusting unit configured to decrease and output a pulse width of the second phase signal.

17. The delay locked loop circuit of claim 16,
    wherein the first pulse width adjusting unit includes:
    a delay section configured to delay and output the first phase signal by a predetermined delay time to obtain a delayed first phase signal;
    a logic element configured to perform a logical operation on the first phase signal and the delayed first phase signal output of the delay section to provide an output; and a logic circuit that performs a logical operation on the output of the logic element and the first phase signal.

18. The delay locked loop circuit of claim 17,
wherein the logic circuit is configured to perform a logical product operation on the output of the logic element and the first phase signal.

19. The delay locked loop circuit of claim 16,
wherein the second pulse width adjusting unit comprises a same structure as the first pulse width adjusting unit.

20. The delay locked loop circuit of claim 15,
wherein the driving part further includes first and second drivers configured to drive the pulse width output of the pulse width adjusting part and the first and second phase signals output of the phase dividing part.

* * * * *